US 9,954,494 B1

(12) United States Patent
Gao et al.

(10) Patent No.: US 9,954,494 B1
(45) Date of Patent: Apr. 24, 2018

(54) METHOD AND CIRCUIT FOR SUPPRESSING POP NOISE IN AN AUDIO OPERATION AMPLIFIER

(71) Applicant: Beken Corporation, Shanghai (CN)

(72) Inventors: Donghui Gao, Shanghai (CN); Jiazhou Liu, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 0 days.

(21) Appl. No.: 15/347,799

(22) Filed: Nov. 10, 2016

(30) Foreign Application Priority Data

Oct. 26, 2016 (CN) .......................... 2016 1 0949358

(51) Int. Cl.
| | |
|---|---|
| *H03F 1/14* | (2006.01) |
| *H03F 1/26* | (2006.01) |
| *H03F 3/185* | (2006.01) |
| *H03F 3/21* | (2006.01) |
| *H03F 3/45* | (2006.01) |
| *H03F 1/34* | (2006.01) |
| *H03F 1/02* | (2006.01) |
| *H03F 3/72* | (2006.01) |

(52) U.S. Cl.
CPC .............. *H03F 1/26* (2013.01); *H03F 1/342* (2013.01); *H03F 3/185* (2013.01); *H03F 3/21* (2013.01); *H03F 3/45179* (2013.01); *H03F 1/0277* (2013.01); *H03F 3/72* (2013.01); *H03F 2203/45151* (2013.01)

(58) Field of Classification Search
CPC . H03F 1/26; H03F 1/342; H03F 3/185; H03F 3/21; H03F 3/45179; H03F 3/217; H03F 3/2171; H03F 3/2173; H03F 3/38; H03F 2200/432; H03F 1/0277; H03F 3/72; H03F 1/04; H03F 1/34; H03G 1/0088
USPC ................................. 330/10, 51, 251, 207 A
See application file for complete search history.

(56) References Cited

U.S. PATENT DOCUMENTS

| | | | | |
|---|---|---|---|---|
| 3,835,412 A | * | 9/1974 | Honda ..................... | H03F 1/305 330/51 |
| 6,127,885 A | * | 10/2000 | Colangelo ............... | H03F 3/217 330/207 A |
| 6,166,596 A | * | 12/2000 | Higashiyama ........ | H03F 1/0222 330/251 |
| 8,710,922 B2 | * | 4/2014 | Holzmann .............. | H03F 3/217 330/251 |
| 2009/0115528 A1 | * | 5/2009 | Wang ....................... | H03F 1/08 330/293 |

* cited by examiner

*Primary Examiner* — Khan V Nguyen
(74) *Attorney, Agent, or Firm* — Perkins Coie LLP

(57) ABSTRACT

A method for suppressing POP noise in an audio operation amplifier, comprising: connecting a first resistor and a second resistor in series at an output stage of the audio operation amplifier by turning on a first switch and a second switch; generating, with a ramp generator, a ramp voltage after an audio signal is input into the audio operation amplifier, wherein the ramp voltage varies from zero to a first value; generating, with an voltage generator, a second voltage, wherein a third switch is turned on and a fourth switch is turned off when the ramp voltage reaches the second value; short-circuiting the first and second resistors by turning off the first and second switches; and outputting, with the audio operation amplifier, an amplified audio signal.

12 Claims, 5 Drawing Sheets

US 9,954,494 B1

METHOD AND CIRCUIT FOR SUPPRESSING POP NOISE IN AN AUDIO OPERATION AMPLIFIER

CLAIM OF PRIORITY

This application claims priority to Chinese Application number 201610949358.8, entitled "A METHOD AND CIRCUIT FOR SUPPRESSING POP NOISE IN AN AUDIO OPERATION AMPLIFIER," filed on Oct. 26, 2016 by Beken Corporation, which is incorporated herein by reference.

TECHNICAL FIELD

The present application relates to an audio operation amplifier and more particularly, but not exclusively, to a method and circuit for suppressing popping noise (POP noise) in an audio operation amplifier.

BACKGROUND OF THE INVENTION

In an audio operation amplifier, there is POP noise produced when an audio power amplifier is switched on or off. This POP noise is annoying to users and may hurt electronic components in the audio operation amplifier.

Conventionally, to eliminate the POP noise, additional components in the amplifier are utilized, such as multiple large capacitors and multiple external contacts. However, these additional components use valuable real estate and increase cost and complexity of the amplifier.

As a result, a new method and circuit for suppressing POP noise in an audio operation amplifier may be necessary.

BRIEF DESCRIPTION OF THE INVENTION

According to an embodiment of the invention, a method and circuit use switches and resistors to suppress POP noise in an audio operation amplifier.

In an embodiment, the method comprises: connecting a first resistor and a second resistor in series at an output stage of the audio operation amplifier by turning on a first switch and a second switch after inputting an audio signal into the audio operation amplifier; generating, with a ramp generator, a ramp voltage, wherein the ramp voltage varies from zero to a first value; generating, with an voltage generator, a second voltage, wherein a third switch is turned on and a fourth switch is turned off when the ramp voltage reaches the second value; short-circuiting the first and second resistors by turning off the first and second switches; and outputting, with the audio operation amplifier, an amplified audio signal.

In another embodiment, the method comprises: connecting the first resistor and the second resistor in series at an output stage of the audio operation amplifier by turning on the first and second switches when stopping inputting the audio signal; turning off the third switch and turning on the fourth switch, wherein the ramp voltage varies from the first value to zero; and turning off the audio operation amplifier.

In still another embodiment, an audio device comprises: an audio operation amplifier; and a circuit in the audio operation amplifier, comprising: a first switch connected to a first resistor in parallel; a second switch connected to a second resistor in parallel; and the first resistor is configured to be connected in series to the second resistor at an output stage of the audio operation amplifier by turning on the first switch and the second switch; a ramp generator connected to the audio operation amplifier via a third switch and configured to generate a ramp voltage after an audio signal is input into the audio operation amplifier, wherein the ramp voltage varies from zero to a first value after the third switch is turned off; a voltage generator connected to the audio operation amplifier via a fourth switch and configured to generate a second voltage, wherein the third switch is turned on and the fourth switch is turned off when the ramp voltage reaches the second value, wherein the first and the second resistors are further configured to be short-circuited by turning off the first and the second switches, and the audio operation amplifier is further configured to output an amplified audio signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
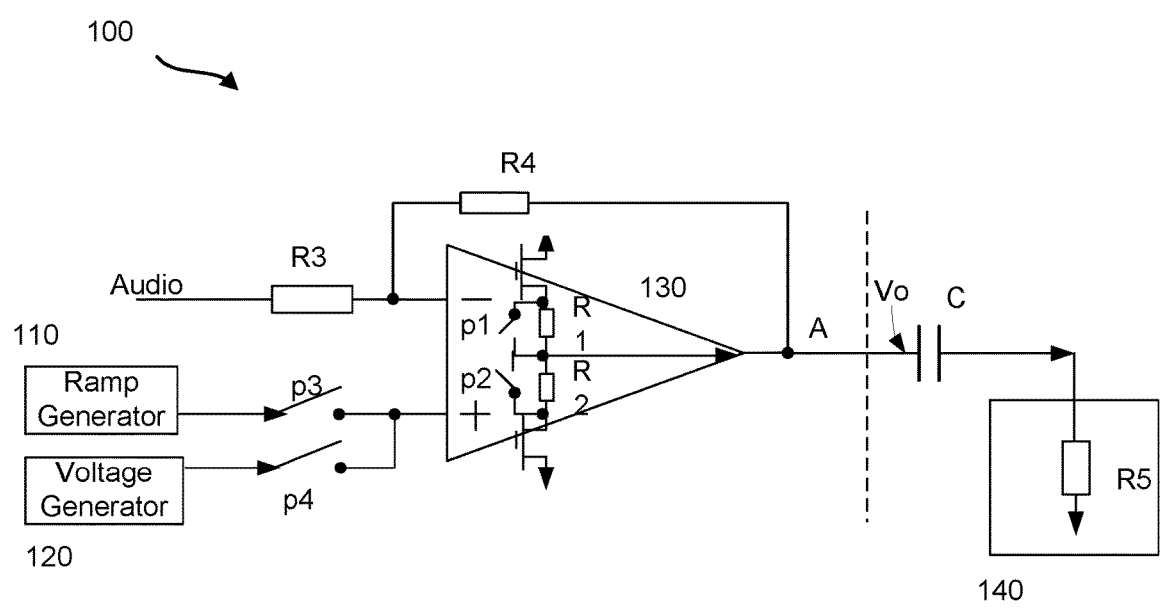
FIG. 1 is a diagram illustrating an embodiment of an audio device for suppressing POP noise in an audio operation amplifier according to an embodiment of the invention.

Now referring to FIG. 1, FIG. 1 illustrates an embodiment of an audio device 100 including an audio operation amplifier 130 for suppressing POP noise. The audio device 100 is an audio power amplifier. In the device 100, an audio signal is input into the audio operation amplifier 130 through a resistor R3 and the audio operation amplifier 130 is connected with a resistor R4 in parallel. A ramp generator 110 is connected to the audio operation amplifier 130 through a switch P3 and a voltage generator 120 is connected to the audio operation amplifier 130 through a switch P4. A capacitor C is connected between the audio operation amplifier 130 and an audio output device 140, for example, earphone or a speaker, etc. The audio output device 140 comprises a resistor R5. For example, the value of the resistor R5 in the earphone is about 16 ohm and the value of the resistor R5 in the speaker is about 600 ohm. Further, as shown in FIG. 1, the circuit in the audio operation amplifier 130 comprises two resistors R1 and R2 and two switches P1 and P2. Wherein two resistors R1 and R2 are coupled at the output stage and two switches P1 and P2 are respectively connected to the resistors R1 and R2 in parallel. If the two switches P1 and P2 are turned on simultaneously, the two resistors R1 and R2 are connected in series at the output stage. If the two switches P1 and P2 are turned off simultaneously, the two resistors R1 and R2 are short-circuited. In one embodiment, during the operation for powering on the audio power amplifier, the switch P3 is turned off after the audio signal is input into the audio operation amplifier. The switches P1 and P2 are turned on. Thus the resistors R1 and R2 are connected in series at the output stage of the amplifier. Then the ramp generator generates the ramp voltage varying from 0 to a first value after the switch P3 is turned off. When the ramp voltage reaches the first value, the switch P4 should be turned off and then the switch P3 should be turned on. The voltage generator has generated a second voltage with a second value before the switch P4 is turned off. In one embodiment, the second voltage generated by the voltage generator is a common-mode voltage and there is a difference between the first value and the second value. In the embodiment, during the voltage changes from the first value to the second value, the output of the audio operation amplifier 130 changes gently due to the existence of resistor R1 and the POP noise can be reduced. In the embodiment, the difference between the first value and the second value can be controlled within 10 mv. Then, the switches P1 and P2 are turned off and the resistors R1 and R2 are short-circuited.

During the operation for powering off the audio power amplifier, the switches P1 and P2 are turned on firstly. Then the resistors R1 and R2 are connected in series at the output stage of the amplifier. The switch P3 is turned off and the switch P4 is turned on. At this time, the output on Vo changes from the second value to the first value slowly. Then the ramp voltage varies from the first value to 0. During this operation, the resistor R2 shares a part of voltage on the capacitor and the voltage on the capacitor can be reduced smoothly. Finally, the audio operation amplifier can be turned off with a smaller POP noise.

Alternatively, the output stage of the audio operation amplifier is a Class-AB output stage.

Figure 2:
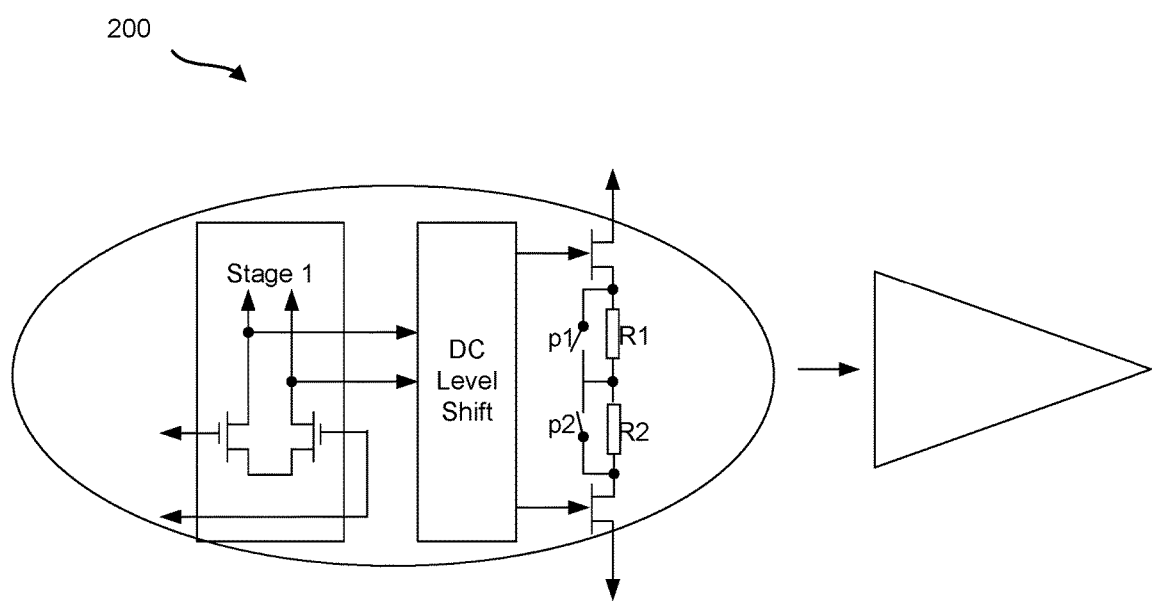
FIG. 2 is a diagram illustrating another embodiment of an audio device for suppressing POP noise in an audio operation amplifier according to a further embodiment of the invention.

In a further embodiment, as shown in FIG. 2, an audio operation amplifier 200 is a multi-stage operation amplifier that can be used in place of the amplifier 130 in the device 100. Wherein, a DC level shift circuit is coupled to a circuit for suppressing POP noise and configured to shift the output stage of the audio operation amplifier. In the embodiment, during the operation for powering on the audio power amplifier, in the process of generating the ramp voltage with a value from 0 to a first value, the output stage 1 of the audio operation amplifier 200 and the DC level shift circuit have established the stable electric level and then the amplifier 200 can immediately stabilize after the ramp voltage reaches the first value. During the operation for powering off the audio power amplifier, the electric level of the output stage 1 and the DC level shift circuit remain stable in the process of the ramp voltage changes from the first value to 0, and after the ramp voltage change is over, the amplifier 200 can be closed stably. Thus, the amplifier 200 can work stably during the operation being powered on and powered down and thus reduced the POP noise.

Figure 3:
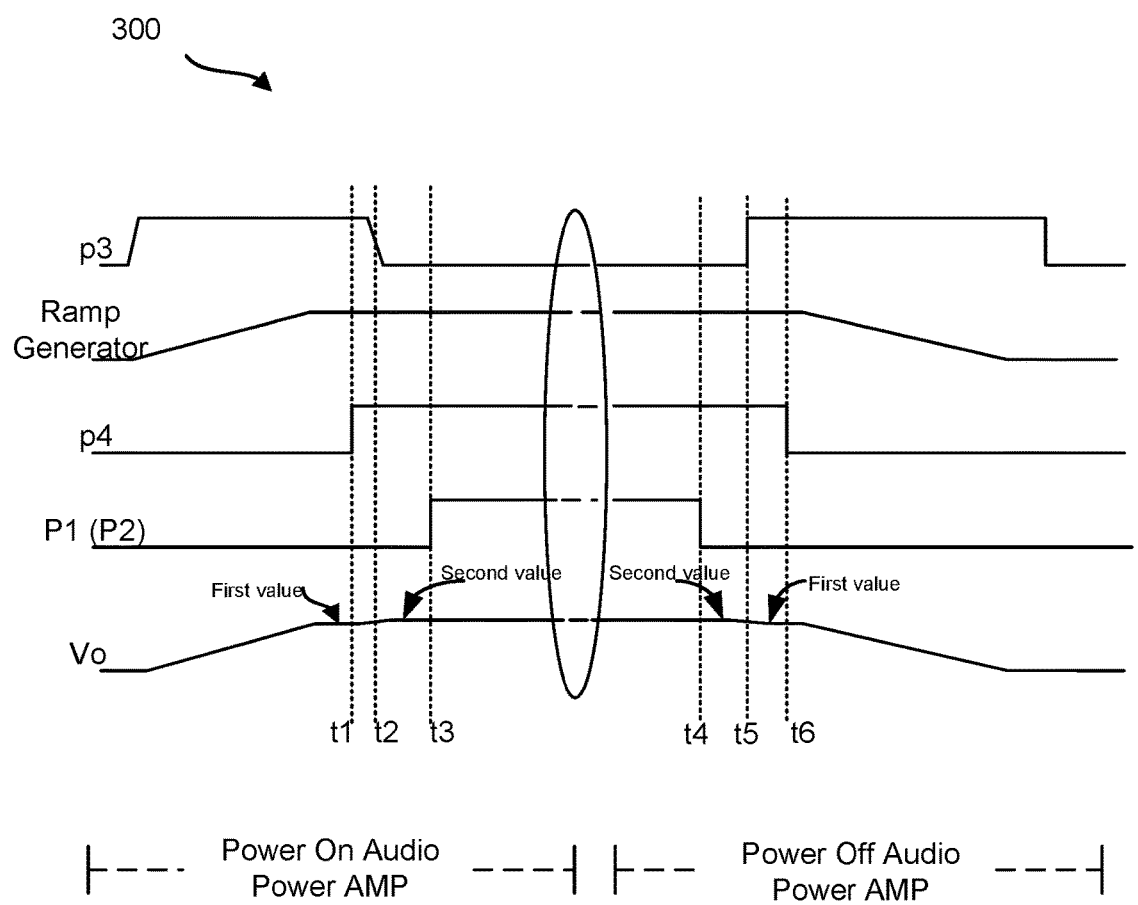
FIG. 3 is a sequence diagram for a circuit for suppressing POP noise in the audio operation amplifier according to a further embodiment of the invention.

FIG. 3 is a sequence diagram for the audio operation amplifier 130 in the audio device 100 according to a further embodiment of the invention. In one embodiment, during the operation for powering on the audio operation amplifier 130, at time $t_1$, the switch P3 is in a high logic level, the ramp voltage reaches the first value, the output of audio operation amplifier 130 also reaches the first value, and the switch P4 jumps to the high logic level, i.e., the switch P4 is turned off. At time $t_2$, the ramp voltage remains stable, the switch P4 is in the high logic level, and the switch P3 is changing from the high logic level to the low logic level slowly. The output of audio operation amplifier 130 also reaches the second value slowly. At time $t_3$, the output of the audio operation amplifier 130 remains stable, the switch P4 is in the high logic level, and the switches P1 and P2 jump to the high logic level, i.e., the switches P1 and P2 are turned off and the resistors R1 and R2 are short-circuited. In another embodiment, during the operation for powering off the audio operation amplifier 130, at time $t_4$, the switches P1 and P2 drop to the low logic level, i.e., the switches P1 and P2 are turned on and the resistors R1 and R2 are connected in series at the output stage of the amplifier 130. At time $t_5$, the switch P3 jumps to the high logic level, the switch P4 is in the high logic level, and the ramp voltage change from the second value to the first value slowly. The output of audio operation amplifier 130 also reaches the first value slowly. At time $t_6$, the switch P4 drops to the low logic level, i.e., the voltage of the voltage generator is off and the ramp voltage start to drop from the first value to zero. The output of audio operation amplifier 130 also drops from the first value to zero. It can be seen from the time sequence in FIG. 3, the voltage change of each element in the audio operation amplifier is relatively smooth and thus the voltage change on the capacitor C in FIG. 1 can also be relatively smooth. Thus, the POP noise can be suppressed or reduced.

Figure 4:
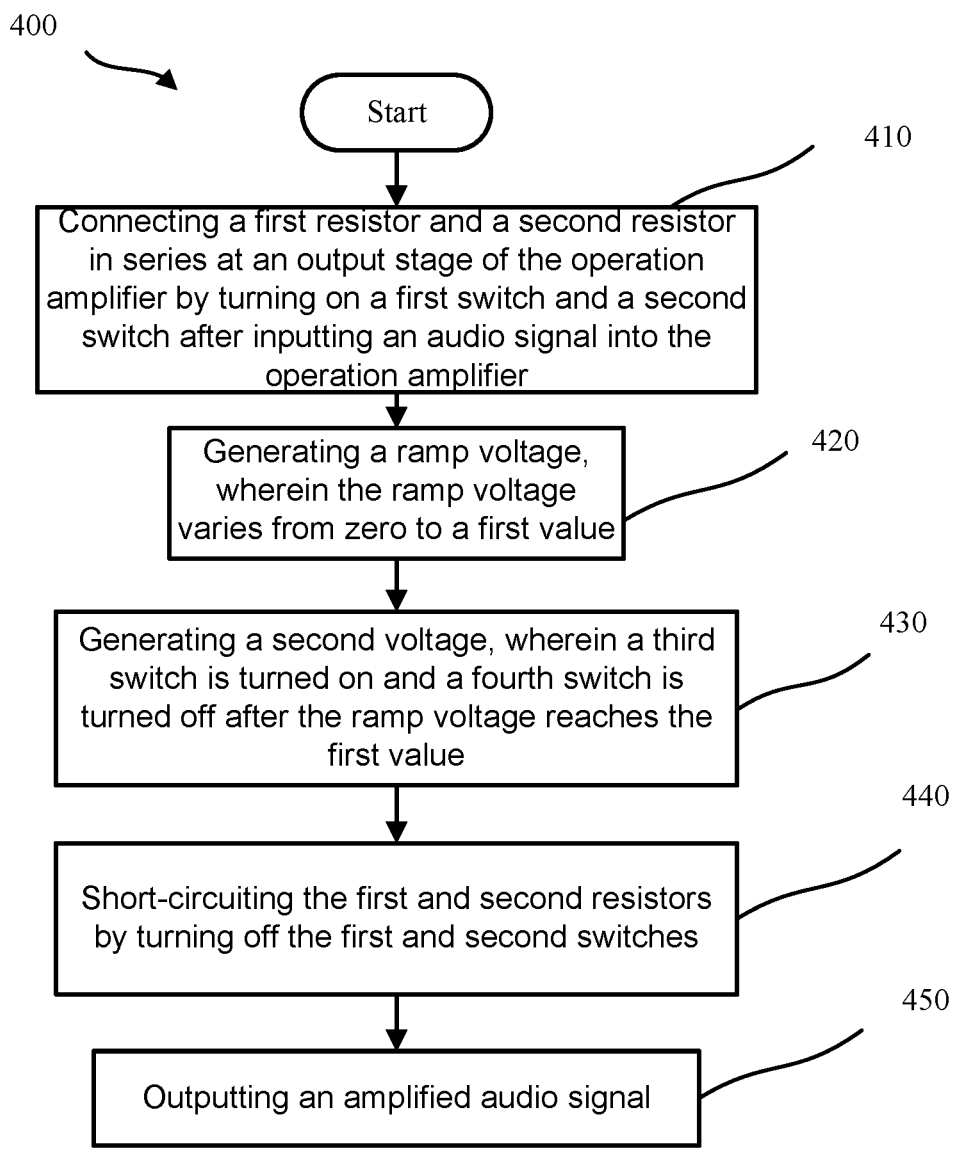
FIG. 4 is a flowchart of a method for suppressing POP noise in an audio operation amplifier according to an embodiment of the invention.

FIG. 4 is a flowchart of a method 400 for suppressing POP noise in an audio operation amplifier according to an embodiment of the invention. The method 400 comprises connecting, in block 410, a first resistor and a second resistor in series at an output stage of the audio operation amplifier by turning on a first switch and a second switch; generating, in block 420, with a ramp generator, a ramp voltage, wherein the ramp voltage varies from zero to a first value after an audio signal is input into the audio operation amplifier; generating, in block 430, with an voltage generator, a second voltage, wherein a third switch is turned on and a fourth switch is turned off when the ramp voltage reaches the first value; short-circuiting, in block 440, the first and the second resistors by turning off the first and the second switches; and outputting, in block 450, with the audio operation amplifier, an amplified audio signal.

Figure 5:
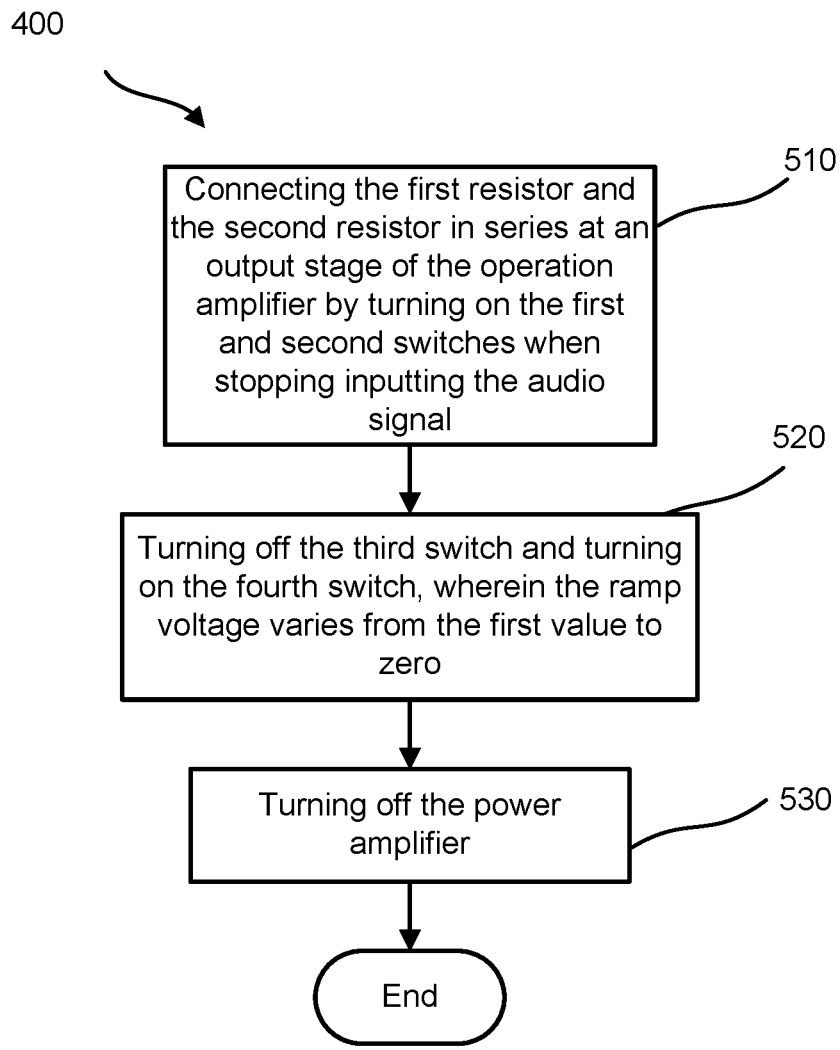
FIG. 5 is a continuation of the method illustrated in FIG. 5.

FIG. 5 is a continuation of the method 400 illustrated in FIG. 4. As shown in FIG. 5, the method 400 further comprises connecting, in block 510, the first resistor and the second resistor in series at an output stage of the audio operation amplifier by turning on the first and the second switches when stopping inputting the audio signal; turning off, in block 520, the third switch and turning on the fourth switch, wherein the ramp voltage varies from the first value to zero; and turning off, in block 530, the audio power amplifier.

Alternatively, the second voltage is a common-mode voltage and a difference between value of the first voltage and the second value is smaller than a value. For example, the value is 10 mV.

Alternatively, the output stage of the audio operation amplifier is a Class-AB output stage.

Alternatively, the audio operation amplifier is a multi-stage operation amplifier.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural components that do not differ from the literal language of the claims, or if they include equivalent structural components with insubstantial differences from the literal languages of the claims.

What is claimed is:

1. An audio device, comprising:
   an audio operation amplifier; and
   a circuit for suppressing POP noise in the audio operation amplifier, comprising:
      a first switch connected to a first resistor in parallel;
      a second switch connected to a second resistor in parallel; and
      the first resistor is configured to be connected in series to the second resistor at an output stage of the audio operation amplifier by turning on the first switch and the second switch simultaneously;
   a ramp generator connected to the audio operation amplifier via a third switch and configured to generate a ramp voltage after an audio signal is input into the audio operation amplifier, wherein the ramp voltage varies from zero to a first value after the third switch is turned off;
   a voltage generator connected to the audio operation amplifier via a fourth switch and configured to generate a second voltage, wherein the third switch is turned on and the fourth switch is turned off when the ramp voltage reaches a second value,
      wherein the first and the second resistors further configured to be short-circuited by turning off the first and the second switches simultaneously, and the audio operation amplifier is further configured to output an amplified audio signal.

2. The audio device of claim 1, wherein the first and the second resistors further configured to be connected in series at the output stage of the audio operation amplifier by turning on the first and the second switches when stopping inputting the audio signal, wherein the output of the audio operation amplifier changes from second to first value slowly;
   the ramp voltage varies from the first value to zero after the third switch is turned off and the fourth switch is turned on; and
   the audio operation amplifier further configured to be turned off.

3. The audio device of claim 1, wherein the second voltage is a common-mode voltage.

4. The audio device of claim 3, wherein a difference between value of the first value and the second value is smaller than 10 mV.

5. The audio device of claim 2, wherein the output stage of the audio operation amplifier is a Class-AB output stage.

6. The audio device of claim 2, wherein the audio operation amplifier is a multi-stage operation amplifier.

7. A method for suppressing POP noise in an audio operation amplifier, comprising:
   connecting a first resistor and a second resistor in series at an output stage of the audio operation amplifier by turning on a first switch and a second switch simultaneously;
   generating, with a ramp generator, a ramp voltage after an audio signal is input into the audio operation amplifier, wherein the ramp voltage varies from zero to a first value;
   generating, with a voltage generator, a second voltage, wherein a third switch is turned on and a fourth switch is turned off when the ramp voltage reaches a second value;
   short-circuiting the first and the second resistors by turning off the first and the second switches simultaneously; and
   outputting, with the audio operation amplifier, an amplified audio signal.

8. The method of claim 7, further comprising:
   connecting the first resistor and the second resistor in series at an output stage of the audio operation amplifier by turning on the first and the second switches when stopping inputting the audio signal;
   turning off the third switch and turning on the fourth switch, wherein the ramp voltage varies from the first value to zero; and
   turning off the audio operation amplifier.

9. The method of claim 7, wherein the second voltage is a common-mode voltage.

10. The method of claim 9, wherein a difference between value of the first value and the second value is smaller than 10 mV.

11. The method of claim 8, wherein the output stage of the audio operation amplifier is a Class-AB output stage.

12. The method of claim 8, wherein the audio operation amplifier is a multi-stage operation amplifier.

* * * * *